(12) United States Patent
Bilyeu et al.

(10) Patent No.: US 7,557,763 B2
(45) Date of Patent: Jul. 7, 2009

(54) HOUSING MOUNTED Z-AXIS ANTENNA COIL

(75) Inventors: Duane Bilyeu, Bloomfield Hills, MI (US); Jill Sara Logsdon, Madison Heights, MI (US); Michael J. Zaitz, Royal Oak, MI (US)

(73) Assignee: Continental Automotive Systems US, Inc., Auburn Hills, MI (US)

( * ) Notice: Subject to any disclaimer, the term of this patent is extended or adjusted under 35 U.S.C. 154(b) by 323 days.

(21) Appl. No.: 11/524,226

(22) Filed: Sep. 20, 2006

(65) Prior Publication Data

US 2007/0085646 A1 Apr. 19, 2007

Related U.S. Application Data

(60) Provisional application No. 60/728,006, filed on Oct. 18, 2005, provisional application No. 60/728,007, filed on Oct. 18, 2005.

(51) Int. Cl.
*H01Q 1/32* (2006.01)
*H01Q 7/08* (2006.01)

(52) U.S. Cl. ........................ 343/713; 343/788
(58) Field of Classification Search ................. 343/713, 343/718, 702, 788; 336/65
See application file for complete search history.

(56) References Cited

U.S. PATENT DOCUMENTS 4,924,237 A    5/1990  Honda et al.
5,359,319 A *  10/1994 Campbell et al. ........... 340/649
5,723,912 A *  3/1998  Ahrabian et al. ........... 307/10.5
5,724,028 A *  3/1998  Prokup ........................ 701/36
6,201,501 B1   3/2001  Arkko et al.
6,392,603 B1   5/2002  Kurz et al.
6,424,301 B1 * 7/2002  Johnson et al. ............. 343/702
7,170,453 B2 * 1/2007  Noguchi et al. ............. 343/702
7,180,454 B2 * 2/2007  Asakura et al. ............. 343/713
7,427,963 B2 * 9/2008  Moriya ....................... 343/788
2005/0007281 A1 1/2005 Furuya

FOREIGN PATENT DOCUMENTS

| EP | 1093183    | 4/2001  |
| GB | 2255447    | 11/1992 |
| JP | 2000091841 | 3/2000  |
| JP | 2001274618 | 10/2001 |
| JP | 2005051595 | 2/2005  |
| WO | 02/27862   | 4/2002  |
| WO | 02/073737  | 9/2002  |
| WO | 03/030297  | 4/2003  |

OTHER PUBLICATIONS

International Search Report and Written Opinion dated Jun. 6, 2007.

* cited by examiner

*Primary Examiner*—HoangAnh T Le (57) ABSTRACT

A fob for a remote keyless entry system includes a printed circuit board (PCB) located within a housing. The PCB includes a surface on which circuitry is printed and components are mounted. A coil is mounted to the surface and provides an antenna for the fob. The coil includes a frame spaced apart from the PCB to provide room for other components on the PCB. Coil mounts extend from the frame and are received by the PCB at coil mount locations. The coil mounts contact the surface of the PCB to form an electrical connection.

14 Claims, 7 Drawing Sheets

HOUSING MOUNTED Z-AXIS ANTENNA COIL

CROSS REFERENCE TO RELATED APPLICATION

The present invention claims priority to U.S. Provisional Patent Applications Nos. 60/728,006 and 60/728,007, both filed Oct. 18, 2005.

BACKGROUND OF THE INVENTION

This invention relates to an antenna for use with printed circuit boards. More particularly, this invention relates to an arrangement for mounting an antenna coil to the printed circuit board.

Remote keyless entry systems include a printed circuit board within a key fob to support circuitry for fob operation. The fob transmits a signal to a vehicle unit and the vehicle doors are unlocked when the signal is confirmed. The printed circuit board supports circuitry required for transmitting and receiving signals from the vehicle unit.

A coil is typically mounted on the circuit board to provide an antenna for transmitting a signal from the fob to the vehicle. One such coil is mounted along a z-axis of the circuit board and is commonly referred to as a z-axis coil. The z-axis coil consumes significant space on the circuit board thereby requiring the circuit board to be larger, which in turn reduces space on the circuit board that could be utilized for other components.

Accordingly, providing an improved arrangement for mounting and retaining a z-axis coil on a printed circuit board is desired.

SUMMARY OF THE INVENTION

An example circuit board includes a mount for an antenna above a surface of the circuit board. More particularly, an example circuit board includes a mount that electrically connects the antenna to the circuit board while providing additional space on the surface of the circuit board.

An example remote keyless entry (RKE) system is located in a vehicle and includes a key fob to transmit and receive signals for locking and unlocking vehicle doors. The fob includes a printed circuit board (PCB) located within a fob housing. The PCB includes a surface on which circuitry is printed and components are mounted. A coil is mounted above the surface to serve as an antenna for the fob. The coil includes a wire wound about a bobbin supported by a frame. The frame includes connectors for providing an electrical connection between the coil and the PCB.

Coil mounts extend from the frame and are received by the PCB at coil mount locations. One of the coil mounts corresponds to a positive terminal of the coil. The other coil mount corresponds to a negative terminal of the coil. The example coil mounts are spring clips or pressfit pins which contact the surface of the PCB to form an electrical connection. Because the coil is mounted above the PCB, other components can be mounted therebetween. Accordingly, spacing the coil above the PCB provides additional space for fob components These and other features of the present invention can be best understood from the following specification and drawings, the following of which is a brief description.

DETAILED DESCRIPTION OF THE PREFERRED EMBODIMENT

Figure 1:
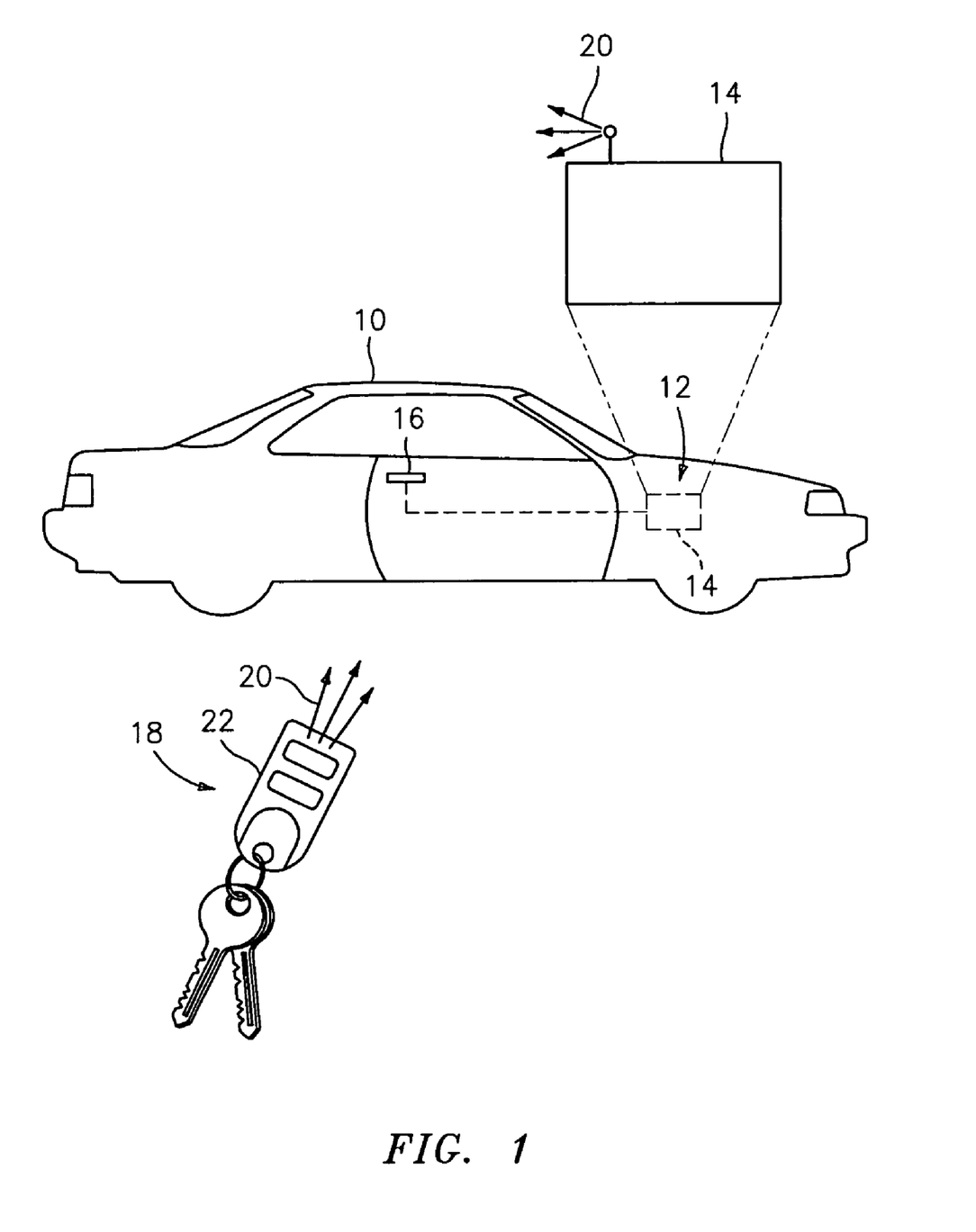
FIG. 1 is a schematic illustration of a vehicle and an example key fob of the present invention.
Figure 2:
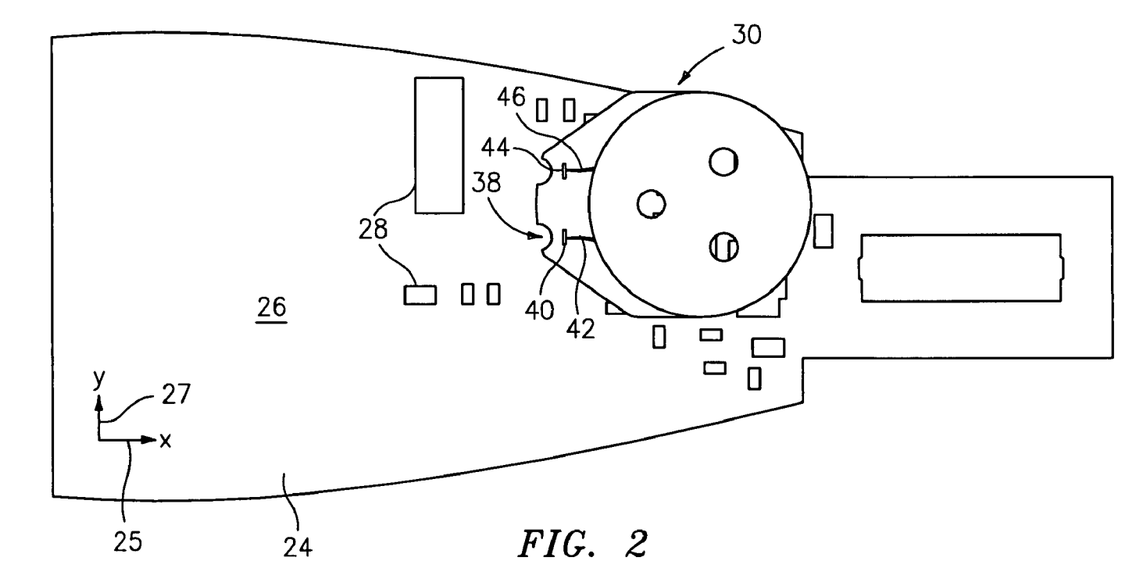
FIG. 2 is a top view of an example z-axis coil mounted an example circuit board.
Figure 3:
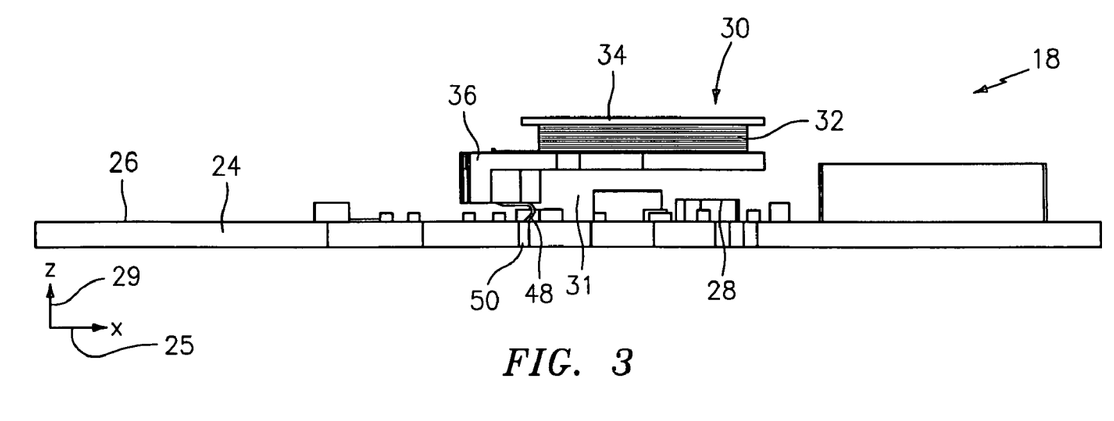
FIG. 3 is a side view of the example circuit board and the example z-axis coil mounted with spring clips.
Figure 4:
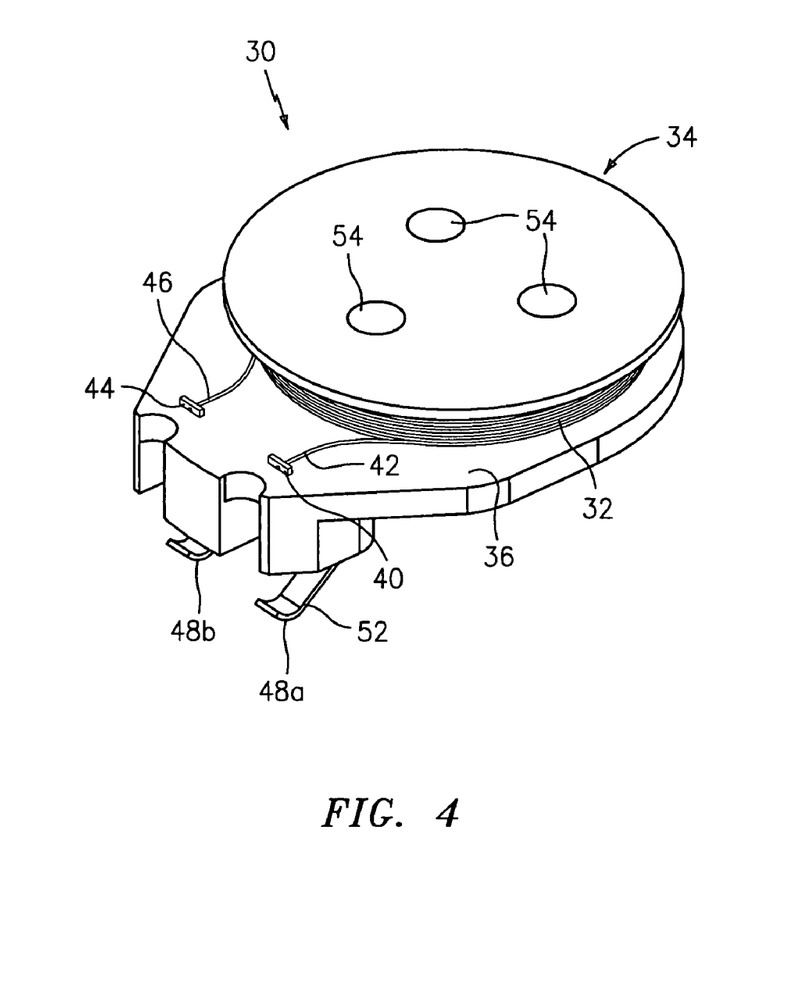
FIG. 4 is a perspective top view of the example z-axis coil including spring clips.

FIG. 1 illustrates a vehicle 10 having an example remote keyless entry (RKE) system 12. The RKE system 12 includes a vehicle unit 14 connected to actuate the vehicle locks 16. The vehicle unit 14 communicates with a key fob 18 to transmit and receive signals 20. The key fob 18 includes activation buttons for locking and unlocking the doors and trunk. The key fob 18 includes a housing 22 and the necessary components to transmit and receive signals from the vehicle unit 14. The signals 20 are transmitted from the fob 18 to the vehicle to prompt a desired action for the RKE system 12.

Referring to FIGS. 2 through 5, the example fob 18 includes a printed circuit board (PCB) 24. The PCB 24 includes a surface 26 on which circuitry is printed and components 28 are mounted. The surface 26 defines an x axis 25 and a y axis 27 at right angles to one another. The x and y-axes 25 and 27 are used to orient and located the PCB components 28 on the surface 26. A z-axis 29 extends perpendicular to the x and y axes 25 and 27 and is used to orientate an antenna of the key fob 19.

A first example coil 30 is mounted to the surface 26 of the PCB 24. The coil 30 is an antenna for the fob 18 to transmit and receive the signal 20 during vehicle communications. The coil 30 includes a wire 32 wound about a bobbin 34. The bobbin 34 extends from and is supported by a frame 36. Preferably, the bobbin 34 and frame 36 are molded as one-piece. The z-axis 29 extends through the center of the wire 32 and bobbin 34 and is at a right angle to the surface 26 of the PCB 24.

The frame 36 includes connectors 38 for providing an electrical connection between the coil 30 and the PCB 24. A positive connection 40 receives a positive lead 42 from the wire 32 and a negative connection 44 receives the negative lead 46 from the wire 32.

Coil mounts 48a and 48b extend from the frame 36 and are received by the PCB 24 at corresponding coil mount locations 50. In the disclosed example, first and second coil mounts 48a and 48b are each received at corresponding coil mount locations 50. The first coil mounts 48a corresponds to the positive connection 40 and is a positive terminal of the coil 30. The second coil mount 48b corresponds to the negative connection 44 and is a negative terminal of the coil 30. In the example shown, the first and second coil mounts 48a, 48b are spring clips 52. The spring clips 52 contact the surface 26 to form an electrical connection between the coil 30 and the surface 26.

The spring clips 52 are v-shaped electrical conductor. One end of the v-shape is connected to the frame 36. The opposing end of the v-shape contacts the surface 26. When the springs clips 52 contact the surface 26 a spring bias, as a result of the v-shape pushes the spring clip 52 toward the surface 26 to maintain contact. Spring clips 52 of other shapes which create a spring bias toward the surface 26 may be used as well.

Figure 5:
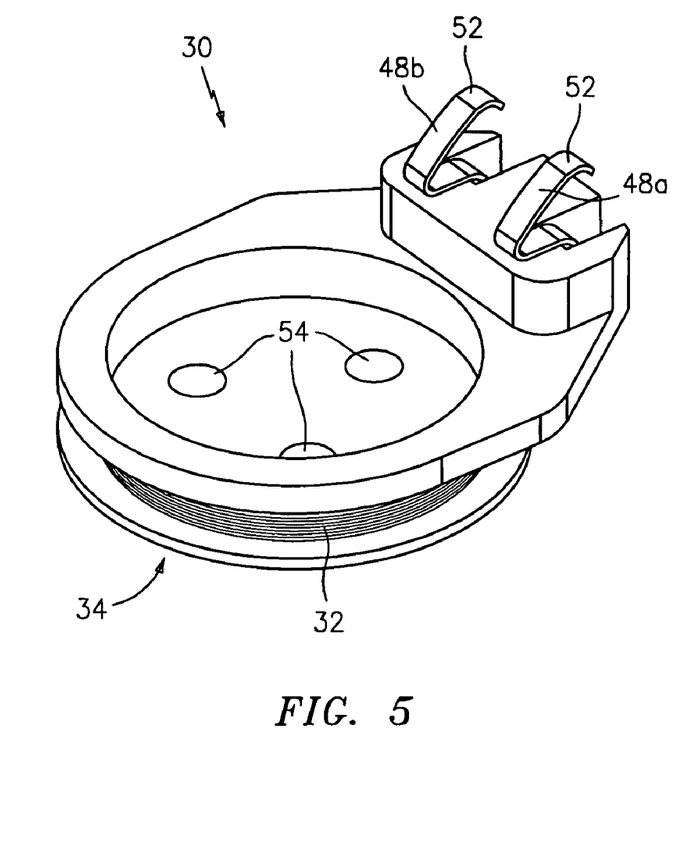
FIG. 5 is a perspective bottom view of the example z-axis coil including spring clips.
Figure 5A:
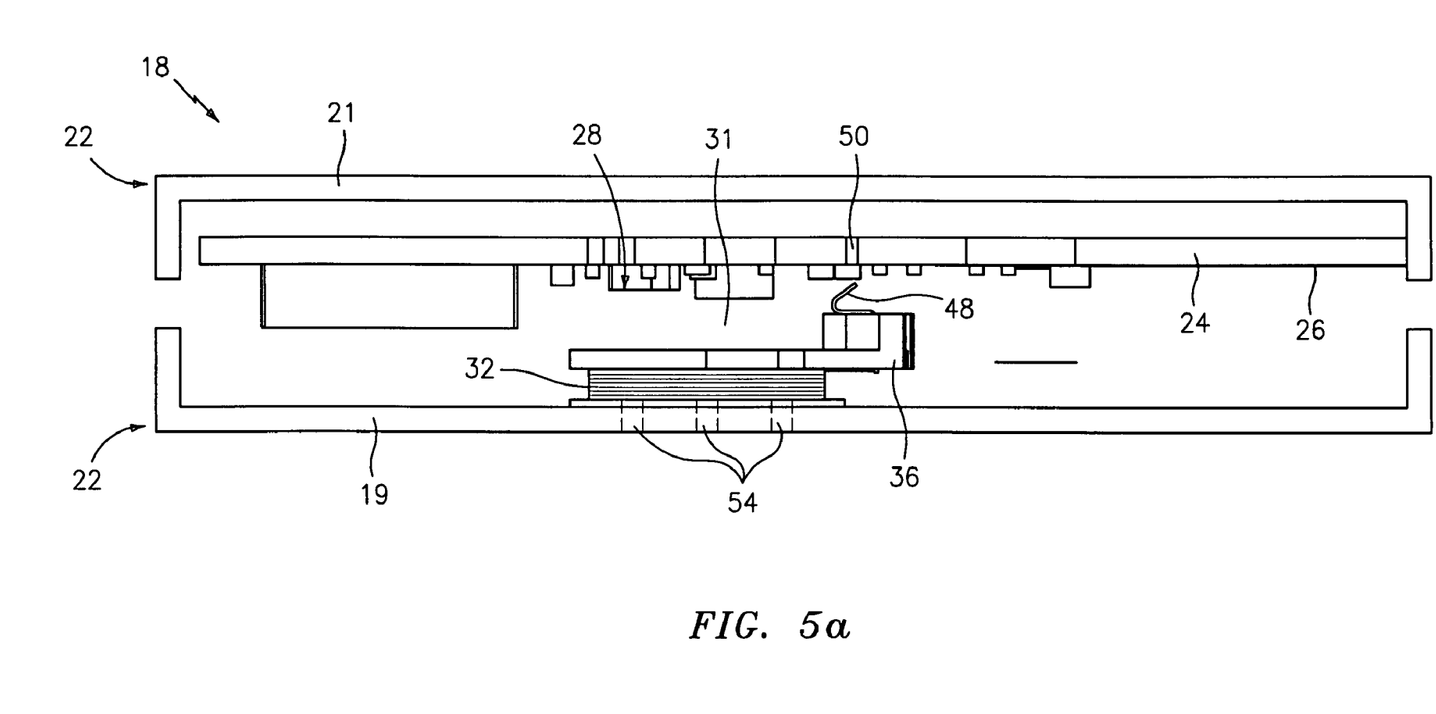
FIG. 5a is a side view of the example z-axis coil and circuit board assembled in the example key fob.
Figure 6:
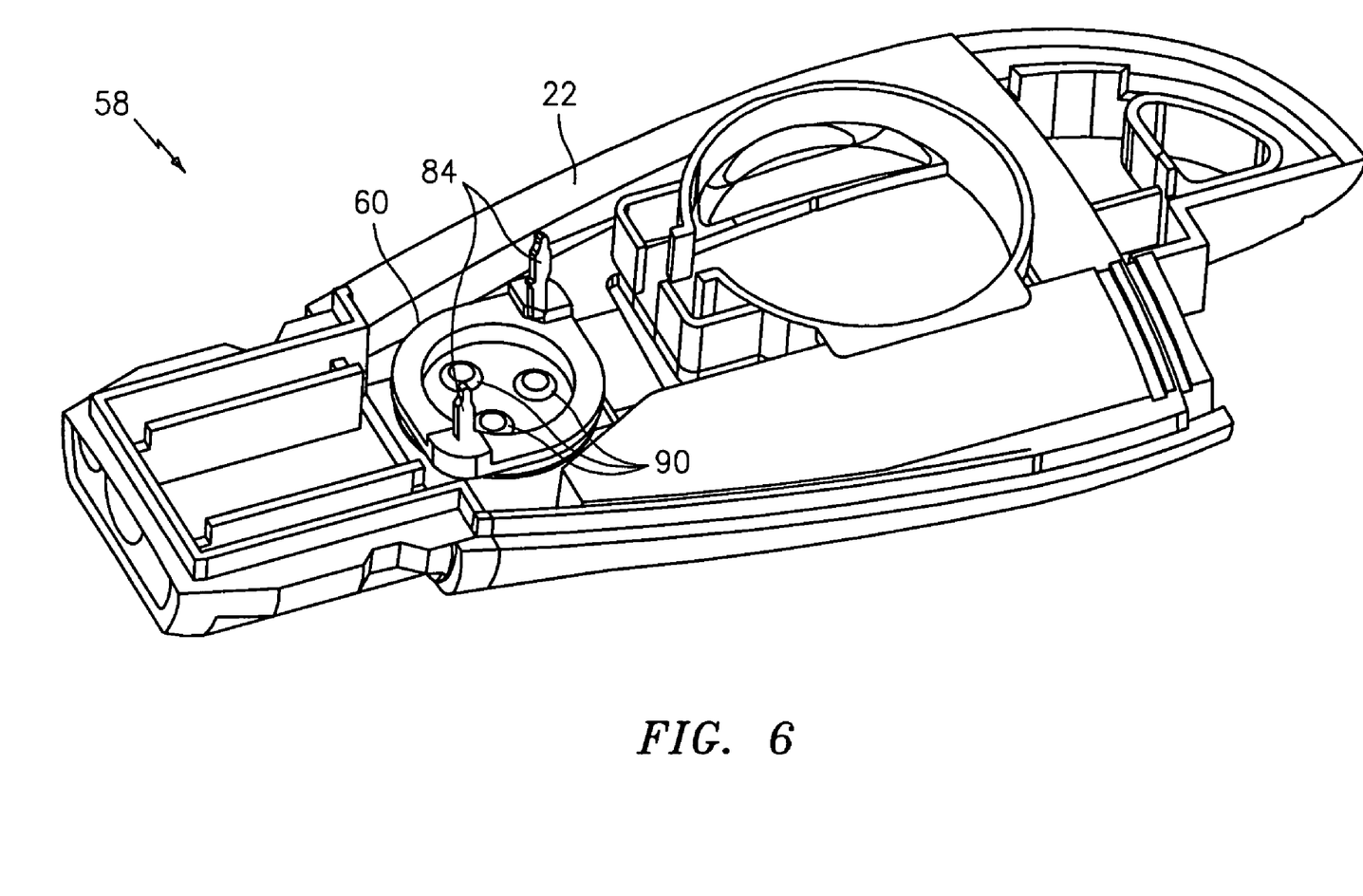
FIG. 6 is a perspective view of another key fob including another example mounting from for a z-axis coil.
Figure 7:
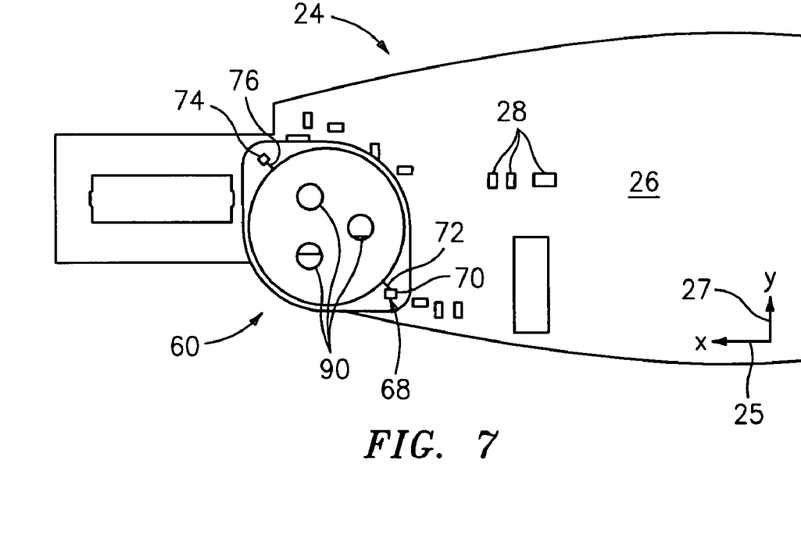
FIG. 7 is a top view of a circuit board including the example frame including pressfit pins.
Figure 8:
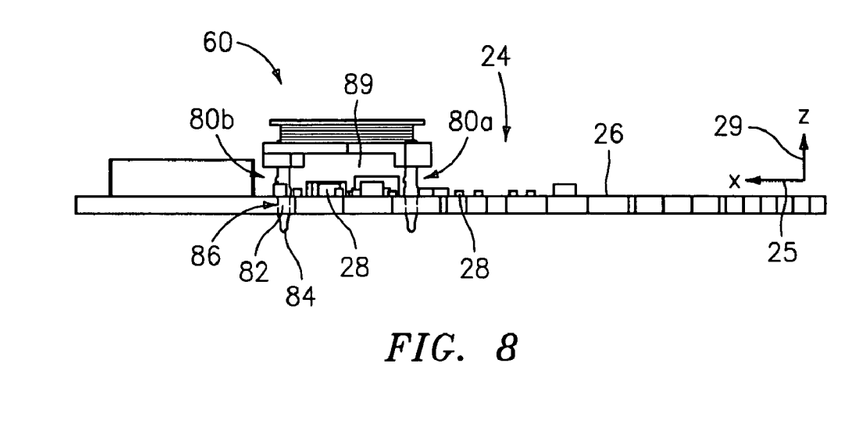
FIG. 8 is a side view of the circuit board including the example z-axis coil mounted with pressfit pins.
Figure 9:
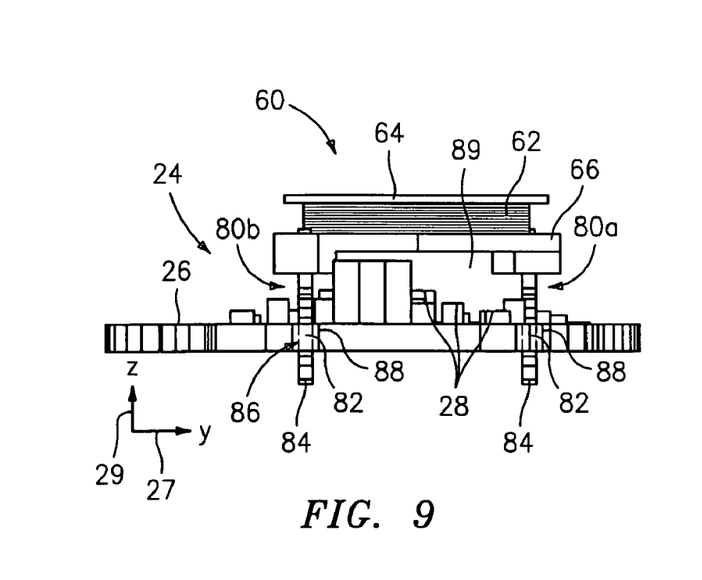
FIG. 9 is an end view of the circuit board having the second example z-axis coil mounted including pressfit pins.
Figure 10:
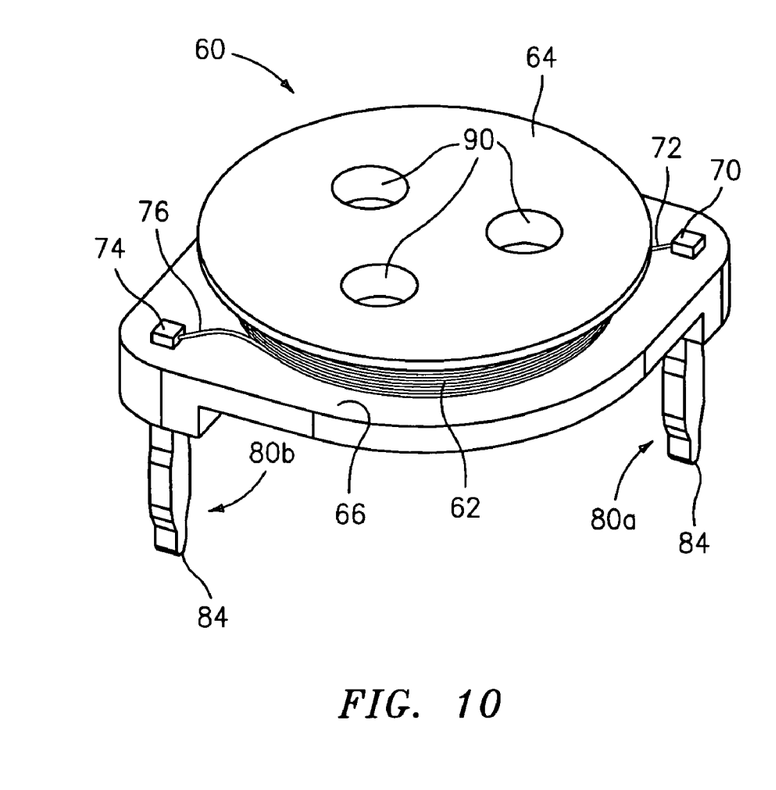
FIG. 10 is a perspective top view the example z-axis coil including pressfit pins.
Figure 11:
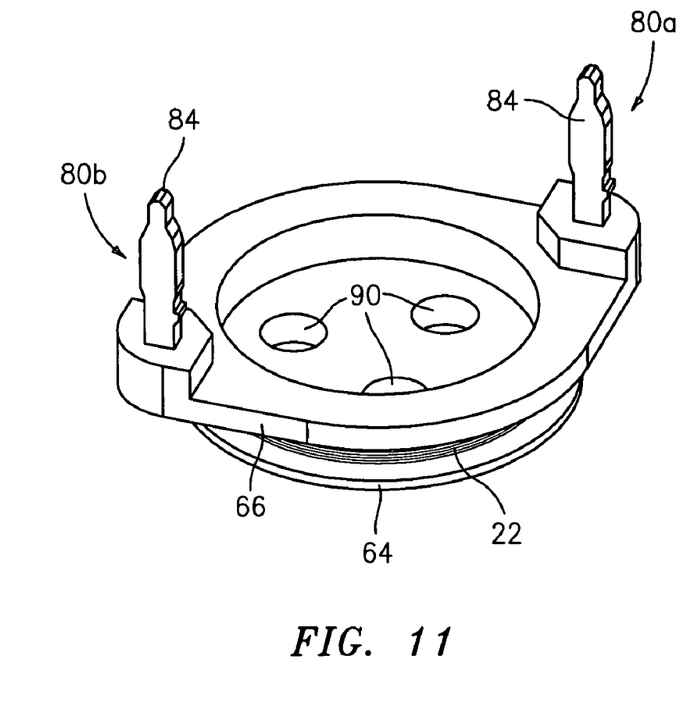
FIG. 11 is a perspective bottom view of the example z-axis coil including pressfit pins.

Referring to FIG. 5a, assembly of the example fob 18 is explained. The frame 36 is mounted to a first housing half 19 of the fob 18 at fob mounting locations 54. The PCB 24 is then assembled within the fob 18 such that the first and second coil mounts 48a and 48b are in contact with the coil mount locations 50 on the PCB 24. A second housing half 21 of the fob housing 22 is secured to the first housing half 19. Once the first housing half 19 and the second housing half 21 are secured, the PCB 24 applies pressure to the spring clips 52 to provide a solid connection between the coil 30 and PCB 24. The frame 36 is spaced apart from the PCB 24, defining a space 31 for components 28 on the PCB 24. The components 28 are mounted to the PCB 24 prior to assembly within the fob 18.

FIGS. 6-11 illustrate another example key fob 58 of the present invention. An example coil 60 is mounted to the surface 26 of the PCB 24. The coil 60 includes a wire 62 wound about a bobbin 64. The bobbin 64 is supported on and extends from a frame 66. Preferably, the bobbin 64 and frame 66 are molded as one-piece. The z-axis 29 extends through the center of the wire 62 and bobbin 64 and is at a right angle to the surface 26 of the PCB 24. The coil 60 is an antenna for the fob 58 to transmit and receive the signals 20 during vehicle communications.

The frame 66 includes connectors 68 for providing an electrical connection between the coil 60 and the PCB 24. A positive connection 72 receives a positive lead 74 from the wire 56 and a negative connection 76 receives the negative lead 78 from the wire 62.

A coil mount 80 extends from the frame 66. The coil mount 80 is received by the PCB 24 at a coil mount location 82. In the example, first and second coil mounts 80a and 80b are received at coil mount locations 82. The first coil mount 80a comprises the positive connection 72 and is a positive terminal of the coil 60. The second coil mount 80b comprises the negative connection 76 and is a negative terminal of the coil 60. In the example shown, the coil mounts 80 are pins 84. Each pin 84 is received within a slot 86 located in the PCB 24. The pins 84 extend from the frame 66 and are shaped to fit the slot 86. The pin 84 fits within the slot 86 with a tight enough fit to ensure that electrical contact is maintained between the pin 84 and the PCB 24. The pin 84 preferably has a press fit within the slot 86, but any fit or shape of the pin 84 which ensures electrical connection is acceptable.

The slots 86 are surrounded by conductive material 88 to form the coil mount locations 82. The pins 84 at each coil mount location 82 create an electrical connection, such that the coil 60 is electrically connected to the PCB 24. The frame 66 is spaced apart from the PCB 24 defining a space 89 for other components 28 on the PCB 24. The components 28 can then be mounted to the PCB 24 prior to mounting of the coil 60.

Once the coil 60 is mounted to the PCB 24, the PCB 24 is assembled within the fob 58. Alternately, the frame 66 is mounted to the fob 58 at fob mounting locations 90. The fob mounting locations 90 are openings that engage tabs on the fob housing 22. The PCB 24 is then assembled within the fob 18 such that the coil mounts 80 are in contact with the coil mount locations 82 on the PCB 24. The fob housing 22 is then assembled to secure the coil 60 and the PCB 24.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A printed circuit board assembly comprising:
   a board having a component surface;
   a coil antenna supported within a bobbin, the coil antenna disposed about an axis transverse to the board; and
   an electrical connection extending from the coil antenna to the board providing electrical communication between the coil antenna and a circuit disposed on the board, the electrical connection providing support for the coil antenna spaced apart from the component surface.

2. The printed circuit board of claim 1, comprising a plurality of electrical connections extending from the bobbin.

3. The printed circuit board of claim 1, wherein the electrical connection is a pin and the board defines a slot for receiving the pin.

4. The printed circuit board of claim 1, wherein the electrical connection is a spring clip and the board defines a spring contact location in contact with the spring clip.

5. The printed circuit board of claim 1, comprising a plurality of housing mounting locations on the bobbin for connecting the antenna to a housing.

6. The printed circuit board of claim 1, wherein a component is disposed between the coil antenna and the circuit board.

7. A remote keyless entry transmitter comprising:
   a transmitter housing;
   a coil antenna wound about a bobbin frame;
   a circuit board having a component surface; and
   an electrical connection extending from the bobbin frame connecting the antenna to the circuit board, the electrical connection supporting the antenna over at least one component affixed to the component surface of the circuit board.

8. The remote keyless entry transmitter of claim 7, wherein the electrical connection is a spring clip and the board defines a spring contact location in contact with the spring clip.

9. The remote keyless entry transmitter of claim 7, wherein a component is mounted on the circuit board and located within a space defined between the circuit board and the antenna.

10. The remote keyless entry transmitter of claim 7, wherein the coil antenna is wound about an axis transverse to the circuit board.

11. A method of assembling a key fob comprising:
   a) mounting an antenna wound about a bobbin frame to a first half of a housing, wherein the antenna is would about an axis transverse to the first half of the housing;
   b) assembling a circuit board to a second half of the housing; and
   c) securing the second half of the housing to the first half of the housing such that the bobbin frame is spaced apart from the circuit board to allow space for a component mounted on the circuit board between the circuit board and the bobbin frame.

12. The method of claim 11, wherein step c) further comprises securing an electrical connection between the circuit board and the antenna.

13. The method of claim 12, wherein step c) further comprises inserting a pressfit pin extending from the bobbin frame within a slot defined by the circuit board.

14. The method of claim 12, wherein step c) further comprises contacting a spring clip extending from the bobbin frame at a contact location on the circuit board to provide electrical communication between the circuit board and the antenna.

* * * * *